(12) United States Patent
Asami

(10) Patent No.: US 7,880,649 B2
(45) Date of Patent: Feb. 1, 2011

(54) ANALOG DIGITAL CONVERTING APPARATUS, ANALOG DIGITAL CONVERTING METHOD, TEST APPARATUS, PROGRAM AND RECORDING MEDIUM

(75) Inventor: Koji Asami, Saitama (JP)

(73) Assignee: Advantest Corporation, Tokyo (JP)

( * ) Notice: Subject to any disclaimer, the term of this patent is extended or adjusted under 35 U.S.C. 154(b) by 7 days.

(21) Appl. No.: 12/428,479

(22) Filed: Apr. 23, 2009

(65) Prior Publication Data

US 2009/0273495 A1 Nov. 5, 2009

(30) Foreign Application Priority Data

Apr. 28, 2008 (JP) ............................. 2008-117211

(51) Int. Cl.
*H03M 1/06* (2006.01)
(52) U.S. Cl. .................. 341/118; 341/155; 341/117; 341/119; 455/561
(58) Field of Classification Search ................ 341/155, 341/117–120; 455/561
See application file for complete search history.

(56) References Cited

U.S. PATENT DOCUMENTS

| | | | |
|---|---|---|---|
| 7,110,795 B2 * | 9/2006 | Doi | 455/562.1 |
| 7,142,137 B2 * | 11/2006 | Batruni | 341/118 |
| 7,352,316 B2 * | 4/2008 | Hori et al. | 341/155 |
| 7,394,415 B2 * | 7/2008 | Fuse et al. | 341/120 |
| 2004/0209652 A1 * | 10/2004 | Doi | 455/561 |
| 2006/0170581 A1 * | 8/2006 | Lin | 341/155 |
| 2007/0030189 A1 * | 2/2007 | Batruni | 341/118 |
| 2007/0120724 A1 * | 5/2007 | Hori et al. | 341/156 |

FOREIGN PATENT DOCUMENTS

JP 2005-347967 12/2005

\* cited by examiner

*Primary Examiner*—Jean B Jeanglaude
(74) *Attorney, Agent, or Firm*—Osha • Liang LLP

(57) ABSTRACT

An AD converting apparatus converts an analog input signal into a digital output signal. The apparatus includes a plurality of AD converters that are supplied with sampling clocks differing from each other by a prescribed phase and that each output an individual signal obtained by digitizing the input signal according to the sampling clock supplied thereto, a common compensating section that commonly compensates for prescribed common non-linear distortion in the individual signals, and a plurality of individual compensating sections that each individually compensate for individual non-linear distortion in a corresponding one of the individual signals. The individual non-linear distortion is obtained as a ratio between the non-linear distortion and the common non-linear distortion in each individual signal. The apparatus further includes a combining section that combines the individual signals to generate the output signal.

19 Claims, 10 Drawing Sheets

US 7,880,649 B2

ANALOG DIGITAL CONVERTING APPARATUS, ANALOG DIGITAL CONVERTING METHOD, TEST APPARATUS, PROGRAM AND RECORDING MEDIUM

CROSS REFERENCE TO RELATED APPLICATION

The present application claims priority from a Japanese Patent Application(s) No. 2008-117211 filed on Apr. 28, 2008, the contents of which are incorporated herein by reference.

BACKGROUND

1. Technical Field

The present invention relates to an AD converting apparatus, an analog-digital converting method, a test apparatus, a program, and a recording medium.

2. Related Art

An interleave AD converting apparatus with a high apparent sampling rate is known as an apparatus for converting an analog input signal into a digital output signal, as in, for example, Japanese Patent Application Publication No. 2005-347967. The interleave AD converting apparatus includes a plurality of AD converters and a combining section.

For example, the AD converters are supplied with sampling clocks that each differ by a prescribed phase. Each AD converter converts the input signal into digital data at timings according to the supplied sampling clock. The combining section arranges a single data sequence by arranging the plurality of data sequences output by the AD converters in an order corresponding to the respective sampling timings.

The AD converting apparatus disclosed in the above Publication compensates each signal output by an AD converter, according to the frequency characteristic of the corresponding AD converter. In this way, the AD converting apparatus 100 can accurately convert the analog input signal into a digital output signal, even if each AD converter has a different frequency characteristic.

However, due to various errors, the curve representing the relation between the amplitude of the input signal and the data value of the output signal after AD conversion deviates from the ideal line, e.g. a straight line. This characteristic of the curve expressing the relation between the amplitude of the input signal and the data value of the output signal deviating from the ideal line is known as a "non-linear characteristic." If the AD converters have different non-linear characteristics, the output signal includes spurious components, which decreases the dynamic range of the interleave AD converting apparatus A technique for compensating for the non-linear characteristics in the output signals of the AD converters has been considered. However, since each AD converter has a different non-linear characteristic, it is necessary to provide a non-linear characteristic compensating circuit for each AD converter. Providing each AD converter with a circuit that compensates for variation of the frequency characteristic and a circuit that compensates for the non-linear characteristic results in an undesirable increase in circuit size.

SUMMARY

Therefore, it is an object of an aspect of the innovations herein to provide an AD converting apparatus, an AD converting method, a test apparatus, a program, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary AD converting apparatus may include an AD converting apparatus that converts an analog input signal into a digital output signal, comprising a plurality of AD converters that are supplied with sampling clocks differing from each other by a prescribed phase, and that each output an individual signal obtained by digitizing the input signal according to the sampling clock supplied thereto; a common compensating section that commonly compensates for prescribed common non-linear distortion in the individual signals; a plurality of individual compensating sections that each individually compensate for individual non-linear distortion in a corresponding one of the individual signals, the individual non-linear distortion obtained as a ratio between the non-linear distortion and the common non-linear distortion in each individual signal; and a combining section that combines the individual signals to generate the output signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
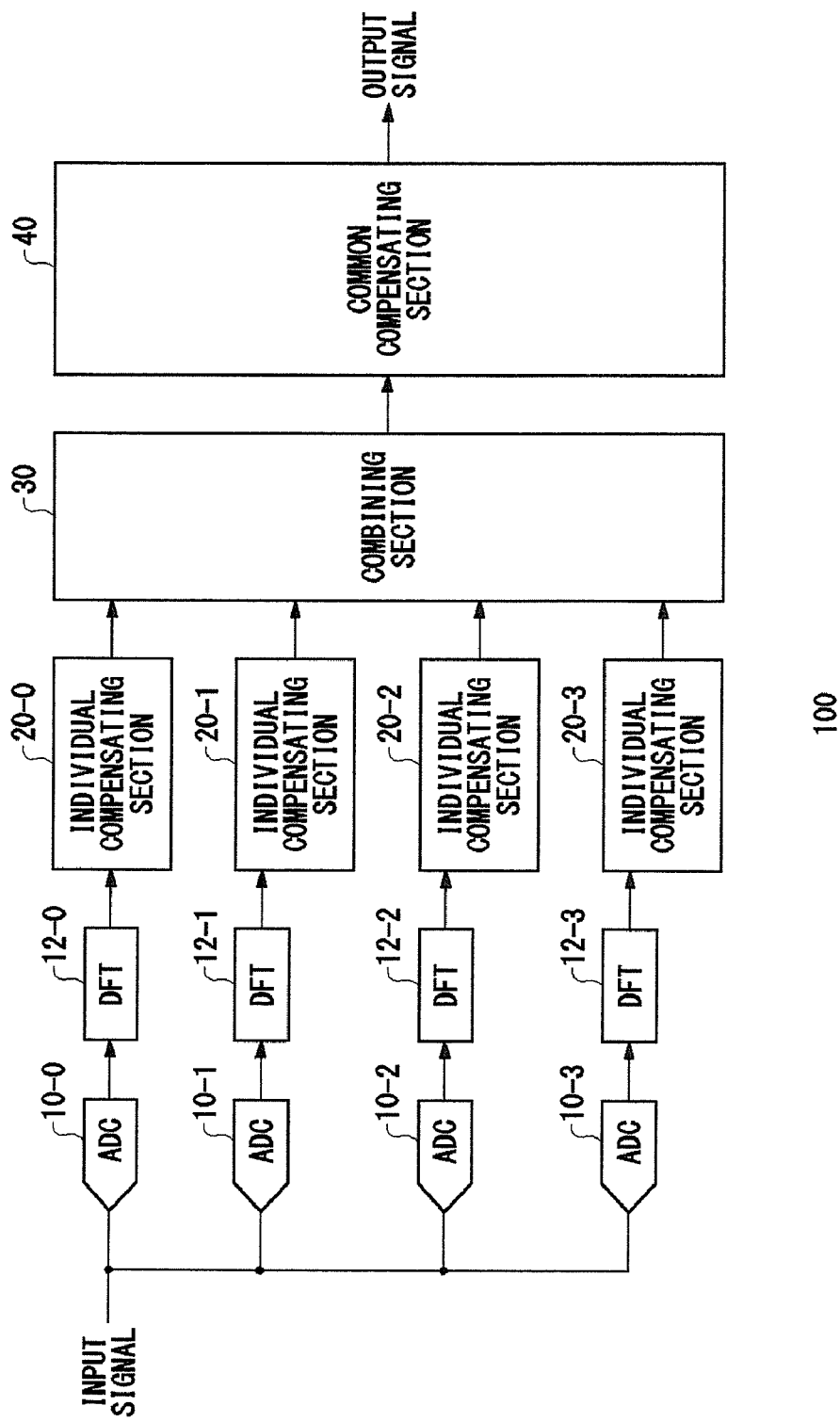
FIG. 1 shows an exemplary functional configuration of an AD converting apparatus 100 according to an embodiment of the present invention.

FIG. 1 is a block diagram showing an exemplary functional configuration of an AD converting apparatus 100 according to an embodiment of the present invention. The AD converting apparatus 100 converts an analog input signal into a digital output signal. The AD converting apparatus 100 includes a plurality of AD converters 10, a plurality of spectrum calculating sections 12, a plurality of individual compensating sections 20, a combining section 30, and a common compensating section 40.

The AD converting apparatus 100 of the present embodiment compensates for signal distortion in an output signal of each AD converters 10 that is caused by linear distortion and non-linear distortion of each AD converters 10. Here, the linear characteristics and non-linear distortion are different for each AD converters 10, and therefore the AD converting apparatus 100 compensates for the linear distortion and the non-linear distortion for each AD converters 10. At this time, a common portion of the non-linear distortion is compensated for by a circuit common to the plurality of AD converters 10. The non-common portion of the non-linear distortion is compensated for along with the linear distortion. In this way, the circuit compensating for the non-linear distortion can be shared, thereby decreasing the overall circuit size. In the example shown in FIG. 1, the AD converting apparatus 100 includes four AD converters 10, four spectrum calculating sections 12, and four individual compensating sections 20.

Each AD converters 10 is supplied with a sampling clock, and these sampling clocks have phases that differ from each other by a prescribed amount. The sampling clocks are described in detail in FIG. 2. An analog input signal is supplied in parallel to the AD converters 10. Each AD converters 10 outputs an individual signal obtained by digitizing an amplitude value of the input signal at the timings of the sampling clock.

With this configuration, the input signal can be sampled at a sampling frequency that is faster than the frequency of the sampling clocks. For example, by setting the period of each sampling clock to as Ts and sequentially shifting the phases of the sampling clocks by Ts/4, the sampling frequency for the input signal can be substantially equal to Ts/4.

The plurality of spectrum calculating sections 12 are disposed to correspond one-to-one with the plurality of AD converters 10. Each spectrum calculating section 12 calculates a spectrum of the individual signal output by the corresponding AD converter 10. For example, each spectrum calculating section 12 may calculate the spectrum of the individual signal by performing a discrete Fourier transform on a data sequence of the individual signal.

Each individual compensating section 20 compensates for (i) individual non-linear distortion, which is obtained as a ratio between the non-linear distortion in the corresponding individual signal and prescribed common non-linear distortion, together with (ii) linear distortion in the corresponding individual signal. The non-linear distortion may refer to signal distortion caused by non-linear characteristics between input and output in an AD converters 10. For example, the non-linear distortion may refer to signal distortion caused by the change in the amplitude of the output signal not being linear with respect to the change in the amplitude of the input signal input to an AD converters 10.

The common non-linear distortion may be a component that is common in the non-linear distortion of the individual signals, or may be non-linear distortion of a certain individual signal set as a reference. The common non-linear distortion may be a predetermined spectrum having a harmonic wave at the same frequency of each individual signal.

Generally, each AD converters 10 includes an analog circuit that operates according to the analog input signal and a sample/hold circuit that samples the input signal according to the sampling clock. The analog circuit and the sample/hold circuit have non-linear characteristics. Furthermore, for each AD converters 10, an output code is allocated to each analog amplitude value and the AD converters 10 outputs an output code that corresponds to the amplitude value detected by the sample hold circuit, but the relationship between the output code value and the amplitude value is sometimes non-linear as well.

The linear distortion may refer to signal distortion caused by the linear characteristics between input and output of an AD converters 10. For example, the linear distortion may refer to signal distortion caused by the frequency characteristic of an AD converters 10. Generally, the frequency characteristic of an AD converters 10 is not flat, and so linear distortion occurs in the output signal because the spectrum of the input signal input to the AD converters 10 does not match the spectrum of the output signal.

The non-linear distortion, common non-linear distortion, and individual non-linear distortion in each individual signal are described further below in relation to FIGS. 3A and 3B. The linear distortion in each individual signal is described further below in relation to FIGS. 4A and 4B.

Each individual compensating section 20 may compensate the spectrum of the corresponding individual signal. More specifically, the individual compensating section 20 may compensate the corresponding individual signal on the frequency axis. The individual compensating section 20 may output the spectrum of the individual signal in which the signal distortion has been compensated for. In the present embodiment, an individual compensating section 20 is provided for each individual signal, and so each individual compensating section 20 individually compensates for the signal distortion in the corresponding individual signal.

The combining section 30 combines the individual signals to form the output signal. The combining section 30 of the present embodiment generates the output signal by combining the individual signals in which the signal distortion has been compensated for by the individual compensating sections 20. The combining section 30 may generate the output signal on the time axis or the frequency axis.

For example, the combining section 30 may generate the individual signals on the time axis by performing an inverse Fourier transform on the spectra output by the individual compensating sections. By merging the data sequences of the individual signals according to the phase relation of the sampling clock, the combining section 30 can combine the plurality of individual signals into a single output signal.

The combining section 30 may generate a spectrum of the output signal by combining the spectra output by the individual compensating sections. In this case, the combining section 30 may generate the output signal on the time axis by performing an inverse Fourier transform on the generated spectrum.

The common compensating section 40 may commonly compensate for the common non-linear distortion, from among the non-linear distortion in the individual signals, in each of the individual signals. The common compensating section 40 of the present embodiment commonly compensates for the common non-linear distortion in the individual signals by compensating for the common non-linear distortion in the output signal combined by the combining section 30.

Figure 2:
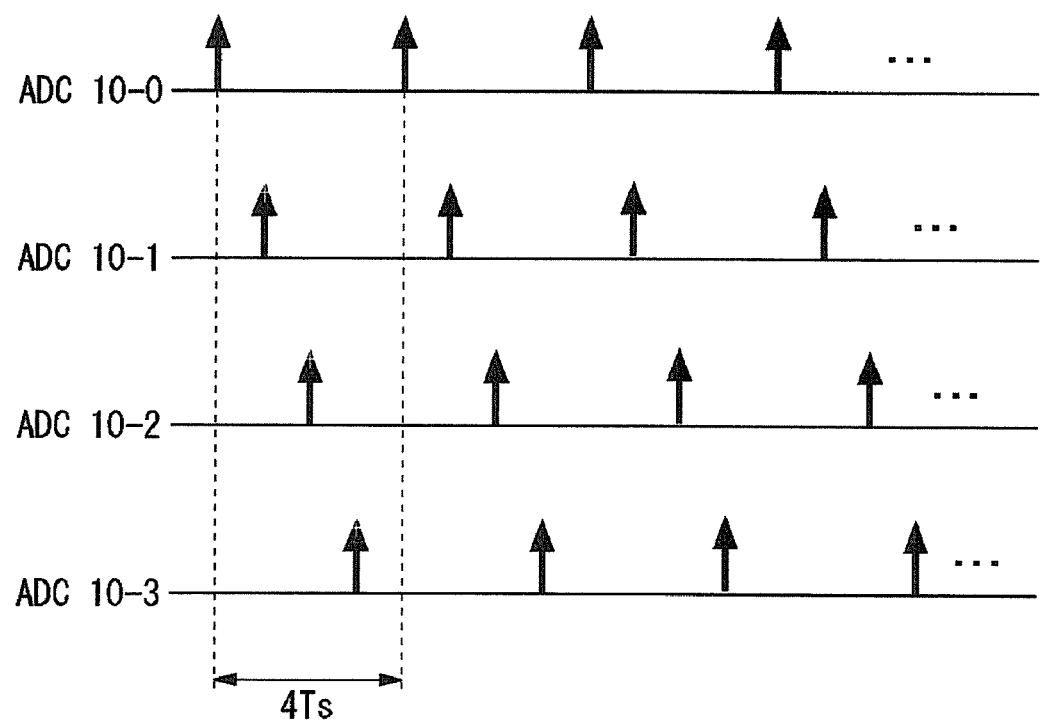
FIG. 2 shows exemplary operations of the plurality of AD converters 10.

FIG. 2 shows exemplary operations of the plurality of AD converters 10. FIG. 2 shows the edge timings of the sampling clocks supplied to the AD converters 10. For example, when converting an analog signal with a band [−1/(2Ts), 1/(2Ts)] into a digital signal, each AD converter is supplied with a sampling clock with a frequency of 1/(4Ts), and the sampling clocks are sequentially shifted by a phase Ts. By using such a sampling clock to sample the analog signal, the analog signal can be sampled at four times as many frequencies as a single sampling clock.

Figure 3A:
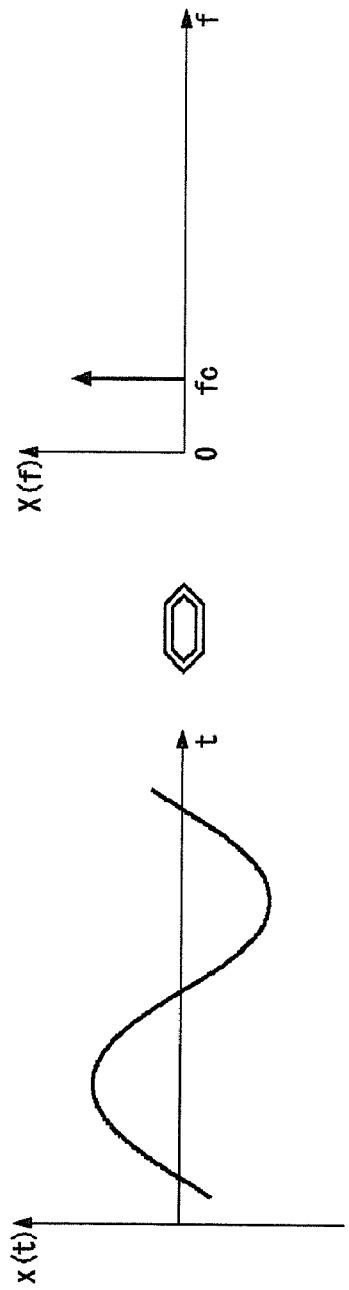
FIG. 3A shows an exemplary time waveform and spectrum of the input signal input to the AD converters 10.
Figure 3B:
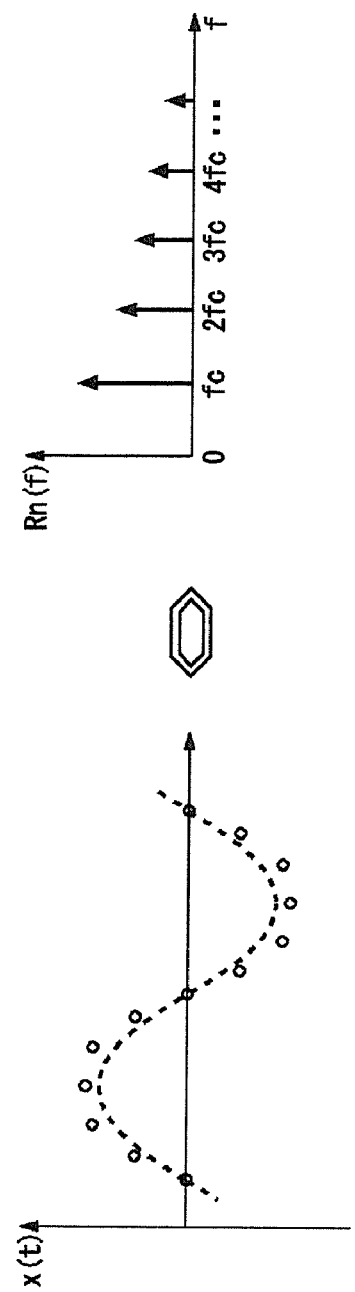
FIG. 3B shows an exemplary time waveform and spectrum of the input signal output from an AD converters 10.

FIGS. 3A and 3B show an example of non-linear distortion. FIG. 3A shows an exemplary time waveform and spectrum of the input signal input to the AD converters 10. FIG. 3B shows an exemplary time waveform and spectrum of the input signal output from an AD converters 10.

In the present embodiment, as shown in FIG. 3A, an input signal having a single frequency component fc is input to the AD converters 10. As shown in FIG. 3B, a certain AD converters 10, which serves as an example of any of the AD converters 10, outputs a data sequence obtained by digitizing the amplitude value of the input signal at prescribed sampling periods.

However, the AD converters 10 has the non-linear characteristics described above, and so the data value output by the AD converters 10 is output with a gain that differs according to the detected amplitude value of the input signal, as shown in FIG. 3B. Therefore, harmonic components $2fc$, $3fc$, $4fc$, etc. occur due to non-linear distortion in the spectrum $Rn(f)$ of the individual signal output by the AD converters $10\text{-}n$. This non-linear distortion may refer to harmonic wave distortion caused by non-linear distortion, such as the amplitude gain being different between input and output in the AD converter 10, for each amplitude value of the input signal or the output signal of the AD converter 10.

Figure 4A:
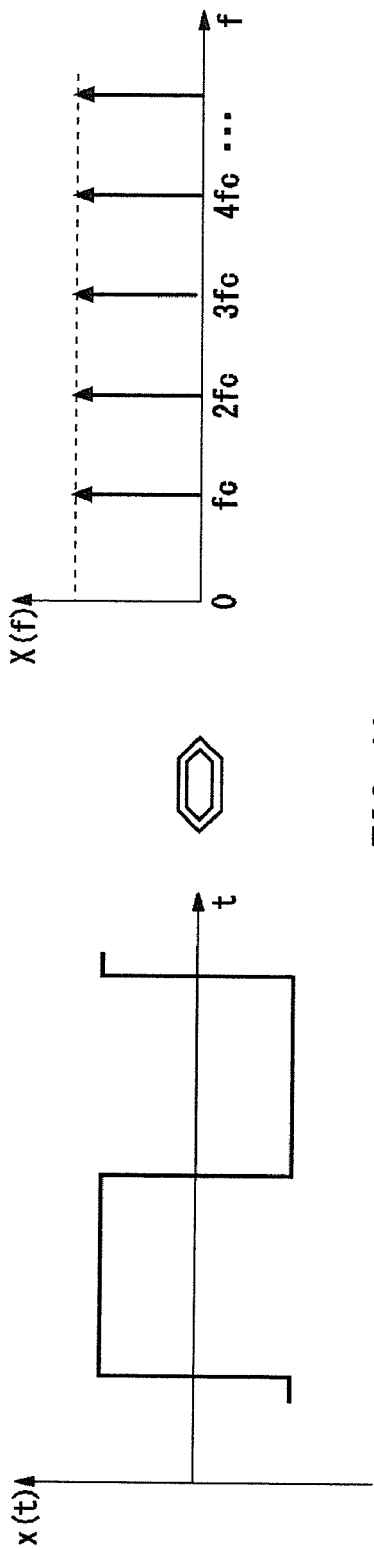
FIG. 4A shows an exemplary time waveform and spectrum of the input signal input to the AD converters 10.
Figure 4B:
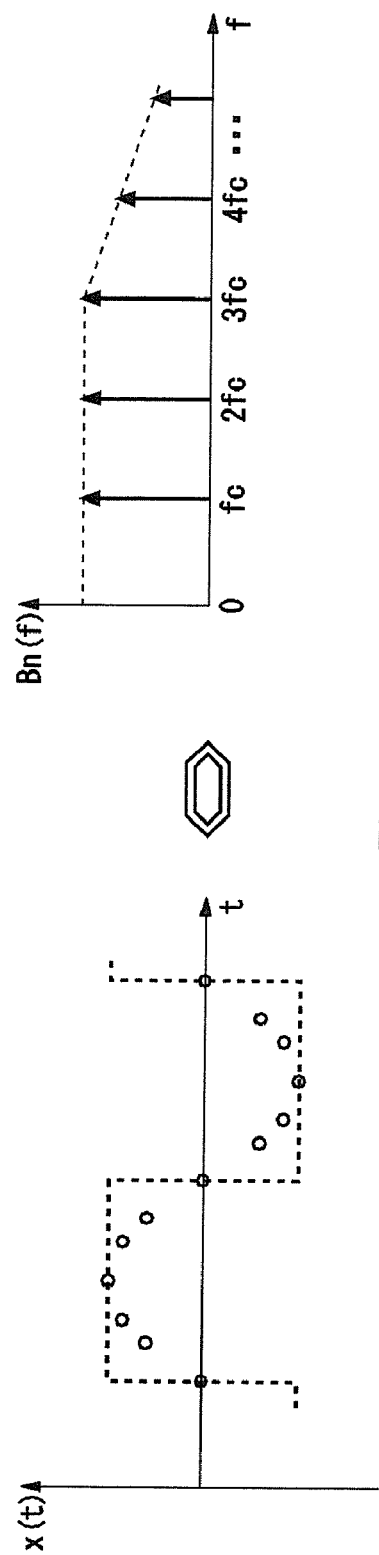
FIG. 4B shows an exemplary time waveform and spectrum of the input signal output from an AD converters 10.

FIGS. 4A and 4B describe an example of linear distortion. FIG. 4A shows an exemplary time waveform and spectrum of an input signal input to the AD converters 10. FIG. 4B shows an exemplary time waveform and spectrum of the input signal output from an AD converters 10.

In the present embodiment, as shown in FIG. 4A, an input signal having a prescribed frequency component is supplied to the AD converters 10. As shown in FIG. 4B, a certain AD converters 10, which serves as an example of any of the AD converters 10, outputs a data sequence obtained by digitizing the amplitude value of the input signal at prescribed sampling periods.

However, the AD converters 10 has the linear characteristics described above, and so the spectrum $Bn(f)$ of the individual signal output by the AD converter $10\text{-}n$ does not match the spectrum $X(f)$ of the input signal, as shown in FIG. 4B. For example, if the AD converters $10\text{-}n$ has a low-pass characteristic, the harmonic components are removed from the individual signal, and so signal distortion occurs in the individual signal. The linear distortion may refer to this type of signal distortion caused by the frequency characteristic of the AD converters 10.

The AD converting apparatus 100 described in relation to FIG. 1 compensates for the non-linear distortion and the linear distortion, which are described in FIGS. 3A to 4B, in the individual signals. Here, each AD converters 10 has different non-linear characteristics and linear characteristics. The AD converting apparatus 100 separates the non-linear distortion into common non-linear distortion and individual non-linear distortion.

Here, the common non-linear distortion may refer to the non-linear distortion in a reference AD converters 10. The individual non-linear distortion in each AD converter may refer to a ratio, for each frequency component, between the spectrum of the non-linear distortion in the reference AD converters 10 and the spectrum of the non-linear distortion in the AD converters 10. The linear distortion may refer to a ratio, for each frequency component, between the spectrum of the input signal and the spectrum of the corresponding individual signal.

The AD converting apparatus 100 compensates for the individual non-linear distortion and the linear distortion together. As described above, the individual non-linear distortion and the linear distortion are both obtained from a function of the gain relative to the frequency, and therefore (i) the same technique can be used to compensate for signal distortion that is a combination of the individual non-linear distortion and the linear distortion and for the individual non-linear distortion and (ii) the linear distortion can be compensated for by a common compensating circuit.

The AD converting apparatus 100 compensates for the common non-linear distortion in each individual signal using a common circuit. With such a configuration, the non-linear distortion in each individual signal can be compensated for without providing a non-linear distortion compensating circuit for each individual signal. As a result, the circuit size of the AD converting apparatus 100 can be decreased.

Figure 5:
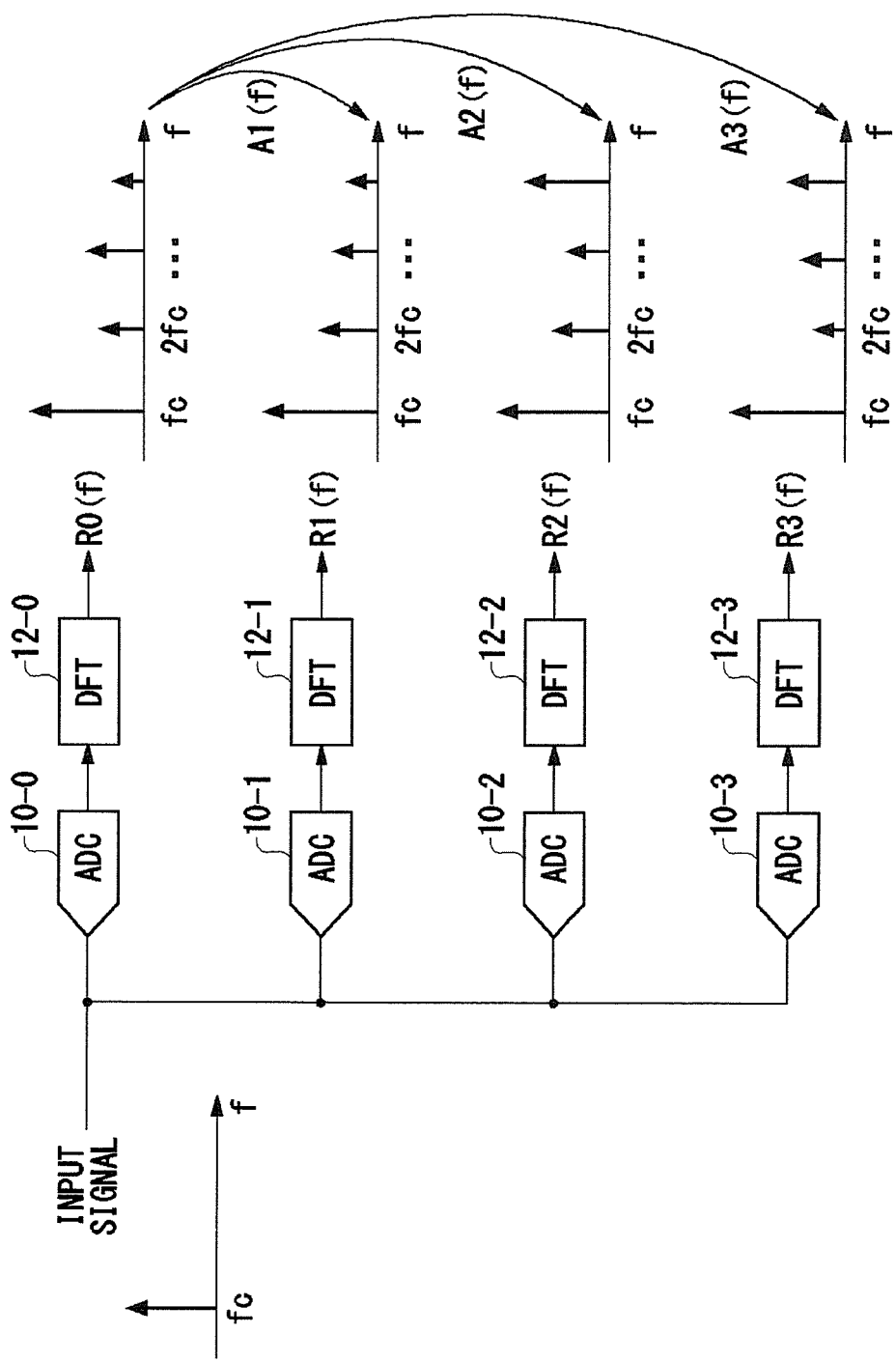
FIG. 5 shows an exemplary method for calculating the individual non-linear distortion and the common linear distortion.

FIG. 5 shows an exemplary method for calculating the individual non-linear distortion and the common linear distortion. FIG. 5 shows an input signal having a single frequency component fc, as shown in FIGS. 3A and 3B, input to the AD converters 10, and shows the spectrum $Rn(f)$ of the individual signal output by each AD converters $10\text{-}n$. When the input signal having the single frequency component fc is input to the AD converters, as shown in FIGS. 3A and 3B, the non-linear distortion causes harmonic components to occur in the spectra of the individual signals. Since the non-linear characteristic of each AD converters 10 is different, the spectrum of each individual signal is different.

Here, the spectrum $R0(f)$ of the individual signal output by the AD converter $10\text{-}0$, which serves here as an example of any of the AD converters, is assumed to have the common non-linear distortion. The common compensating section 40 compensates for the signal distortion caused by this common non-linear distortion.

The common compensating section 40 then calculates the individual non-linear distortion $An(f)$ by comparing the spectrum $R0(f)$ of the reference individual signal to the spectrum $Rn(f)$ of another individual signal. Here, the individual non-linear distortion $An(f)$ may be a function that indicates, for each frequency, a level ratio between the harmonic component in each individual signal and the harmonic component in the reference individual signal.

In other words, the individual non-linear distortion $An(f)$ may be a function showing the correlation between the spectrum $R0(f)$ of the reference individual signal and the spectrum $Rn(f)$ of each individual signal. Instead, the individual non-linear distortion $An(f)$ may be a transfer function of a system where the spectrum $R0(f)$ of the reference individual signal is the system input and the spectrum $Rn(f)$ of each individual signal is the system output.

Each individual compensating section 20 may compensate for the individual non-linear distortion in the corresponding individual signal based on an individual non-linear distortion compensation coefficient for compensating for the individual non-linear distortion described above. The individual non-linear distortion compensation coefficient may be defined as an inverse function of the individual non-linear distortion $An(f)$ described above.

Figure 6:
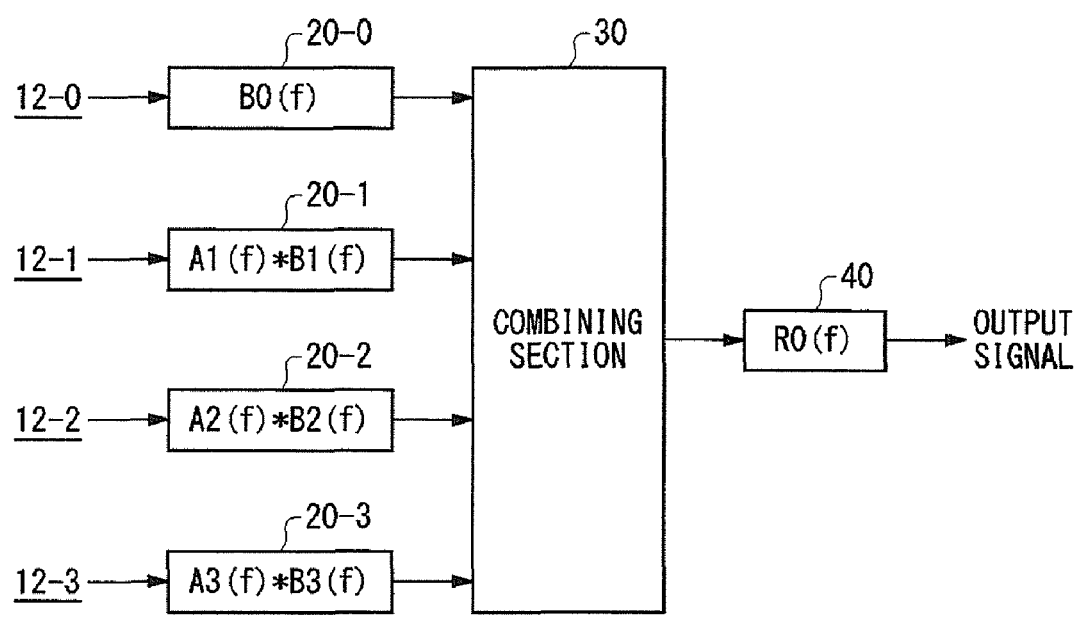
FIG. 6 shows an exemplary distortion compensation performed by the AD converting apparatus 100.

FIG. 6 shows an exemplary distortion compensation performed by the AD converting apparatus 100. As described above, each individual compensating section 20 compensates for the individual non-linear distortion An(f) and the linear distortion Bn(f) together. The individual compensating section 20 corresponding to the reference individual signal may compensate for the linear distortion B0(f) without compensating for the individual non-linear distortion.

For example, each individual compensating section 20 may compensate the corresponding individual signal using a combined individual compensation coefficient, which is obtained by combining (i) an individual linear distortion compensation coefficient for compensating for the signal distortion caused by the frequency characteristic of the corresponding AD converters 10 and (ii) the individual non-linear distortion compensation coefficient for compensating for the individual non-linear distortion. As described above, the linear distortion and the individual non-linear distortion caused by the frequency characteristic can be obtained from a function indicating the relationship between the frequency and the gain. Therefore, the individual non-linear distortion compensation coefficient and the combined individual compensation coefficient for correcting these distortions can be obtained from an inverse of the function showing the relationship between the frequency and the gain. Each individual compensating section 20 may be supplied with the combined individual compensation coefficient obtained by combining these functions. Furthermore, after combining the individual linear distortion and the individual non-linear distortion, each individual compensating section 20 may be supplied with the combined individual compensation coefficient generated to compensate for the combined distortion.

The distortion Cn(f) that is compensated for using the combined individual compensation coefficient may be calculated as a product of the complex individual non-linear distortion An(f) and the complex linear distortion Bn(t). For example, assume the following:

$$An(f)=A(f)\cdot\exp(j\theta(f))$$

$$Bn(f)=B(f)\cdot\exp(j\theta(f))$$

In this case, the distortion Cn(f) can be calculated as shown below.

$$Cn(f) = An(f)\cdot Bn(f)$$
$$= A(f)\cdot B(f)\cdot \exp(j(\theta(f)+\varphi(f)))$$

Each individual compensating section 20 may use a combined individual compensation coefficient obtained from the inverse function of the distortion Cn(f).

For example, each individual compensating section 20 may compensate the corresponding individual signal using the technique disclosed in Japanese Patent Application Publication No. 2005-347967, mentioned above. By using this technique, each individual compensating section 20 can calculate a coefficient for compensating for the linear distortion in the corresponding individual signal.

More specifically, each individual compensating section 20 divides the frequency band of the corresponding individual signal according to the number of AD converters 10. Each individual compensating section 20 then calculates, based on the frequency characteristics of all of the AD converters, a first compensation coefficient by which the corresponding individual signal is multiplied to cancel out the spurious components in the individual signal caused by the frequency characteristic of the corresponding AD converters 10.

Next, a plurality of the individual compensating sections 20 calculate, for each divided frequency band, second compensation coefficients for compensating for the error in the phase of the signal components of the individual signals caused by the multiplication with the first compensation coefficient, based on the respective first compensation coefficients and frequency characteristics. Each individual compensating section 20 may then calculate the combined individual compensation coefficient by combining the individual non-linear distortion compensation coefficient and the compensation coefficient calculated based on the frequency characteristic of the corresponding AD converters 10.

The combining section 30 combines the individual signals compensated by the individual compensating sections 20. The common compensating section 40 compensates the output signal combined by the combining section 30 using a common non-linear distortion compensation coefficient corresponding to the common non-linear distortion R0(f). With this configuration, the non-linear distortion and linear distortion caused by each AD converters 10 can be easily compensated for by a circuit having a small circuit size.

Figure 7:
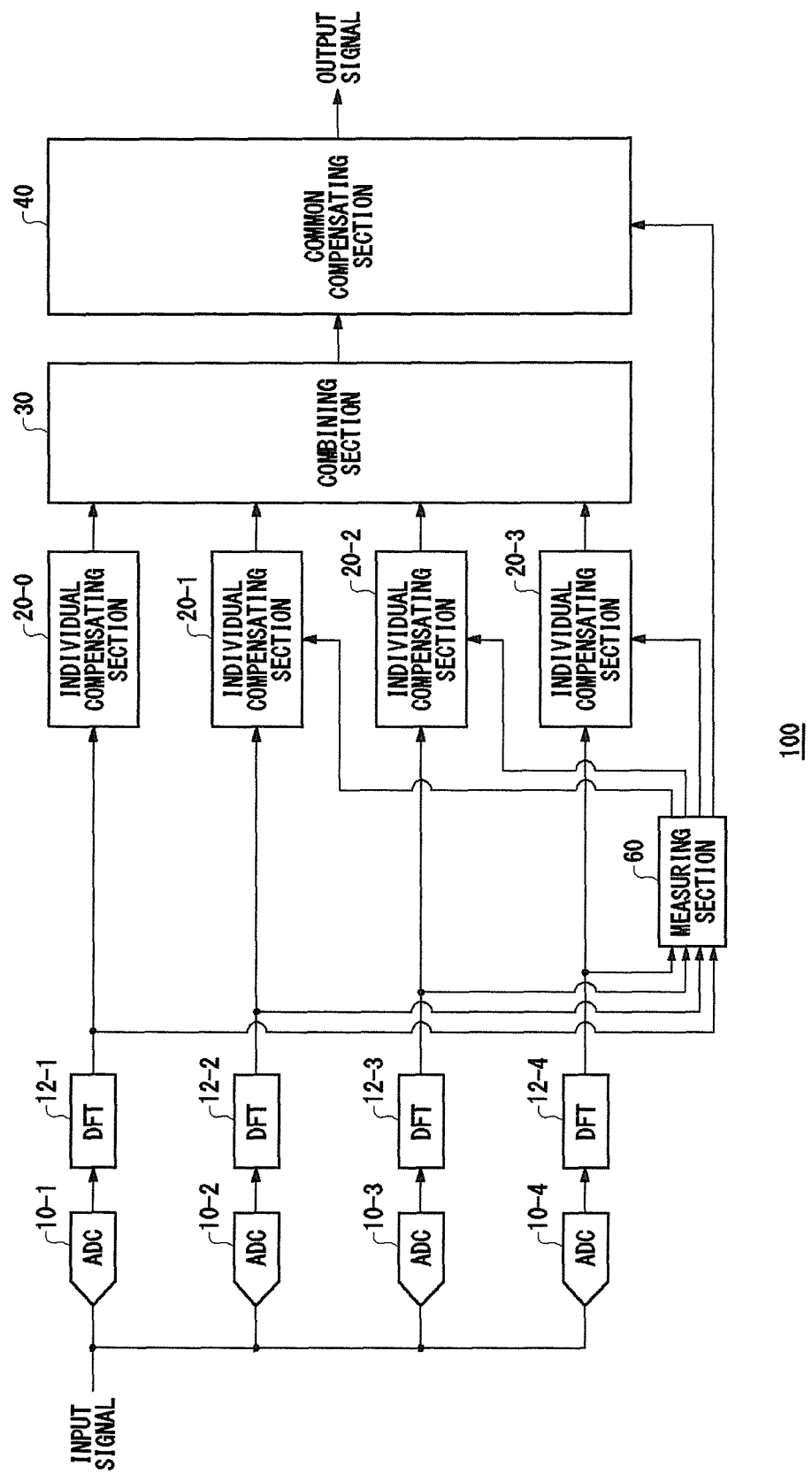
FIG. 7 shows another exemplary configuration of the AD converting apparatus 100.

FIG. 7 shows another exemplary configuration of the AD converting apparatus 100. The AD converting apparatus 100 of the present embodiment is further provided with a measuring section 60 in addition to the configuration of the AD converting apparatus 100 described in relation to FIGS. 1 to 6. The remaining configuration of the AD converting apparatus 100 may be the same as that shown in FIGS. 1 to 6.

The measuring section 60 may calculate the individual non-linear distortion compensation coefficient, the common non-linear distortion compensation coefficient, and the combined individual compensation coefficient described above, and set each individual compensating section 20 and common compensating section 40. The measuring section 60 may receive the individual signals in parallel with the individual compensating sections 20. The measuring section 60 of the present embodiment receives the spectra of the individual signals in parallel with the individual compensating sections 20.

The measuring section 60 may calculate each individual non-linear distortion compensation coefficient based on the spectrum of the reference individual signal and the spectrum of the corresponding individual signal. As described above, the measuring section 60 may calculate the individual non-linear distortion compensation coefficient at each frequency based on a level ratio of each corresponding harmonic component in the spectrum of the reference individual signal and the spectra of the other individual signals.

The measuring section 60 may be supplied with the linear characteristics of the AD converters or with the individual linear distortion compensation coefficients for compensating for the signal distortion caused by the these linear characteristics. The measuring section 60 then combines the linear characteristics of the AD converters with the individual non-linear distortion to calculate the combined individual compensation coefficient for compensating for the combined signal distortion. The measuring section 60 may instead calculate the combined individual compensation coefficient by combining the individual linear distortion compensation coefficients supplied thereto with the individual non-linear distortion compensation coefficients. The combination of the linear characteristics and the individual non-linear distortion by the measuring section 60 can be achieved by a convolution of these characteristics, for example. In the same way, the combination of the individual linear distortion compensation coefficients and the individual non-linear distortion compensation coefficients can be achieved by a convolution of these functions. As described above, the measuring section 60 may calculate the combined individual compensation coefficient on the frequency axis by combining the corresponding individual non-linear distortion compensation coefficient and the individual linear distortion compensation coefficient on the frequency axis.

The measuring section 60 may generate the compensation coefficients described above and set the coefficients for the individual compensating sections 20 and common compensating sections 40 before the AD converting apparatus 100 begins actual operation. In this case, the measuring section 60 may supply each AD converters 10 with an input signal having a single frequency component.

The measuring section 60 may sequentially change the frequency of the input signal input to the AD converters 10, and generate a compensation coefficient for each frequency of the input signal. The measuring section 60 may store the generated compensation coefficients in association with the corresponding frequencies of the input signal. In this case, during actual operation of the AD converting apparatus 100, the measuring section 60 may select the compensation coefficients to be set in the individual compensating sections 20 and the common compensating sections 40 based on the frequency of the input signal. The frequency of the input signal when the AD converting apparatus 100 is operating may be set by a user or the like, or the measuring section 60 may measure the frequency when the AD converting apparatus 100 is operating.

If the input signal has a plurality of frequency components, the measuring section 60 may select the compensation coefficients according to the principal frequency component of the input signal. The principal frequency component may refer to the frequency component having the greatest power.

The measuring section 60 may generate the compensation coefficients described above during actual operation of the AD converting apparatus 100, and set the coefficients in the individual compensating sections 20 and the common compensating sections 40 at this time. In this case, the measuring section 60 desirably generates the compensation coefficients based on the individual signals at a time when an input signal having a single frequency component is input to the AD converters 10. Each individual compensating section 20 may compensate the corresponding individual signal based on the compensation coefficient set by the measuring section 60.

As described above, the combining section 30 may combine the spectra compensated by the individual compensating sections 20 to form the output signal in the time domain. The common compensating section 40 may compensate the output signal from the combining section 30 in the time domain.

Figure 8:
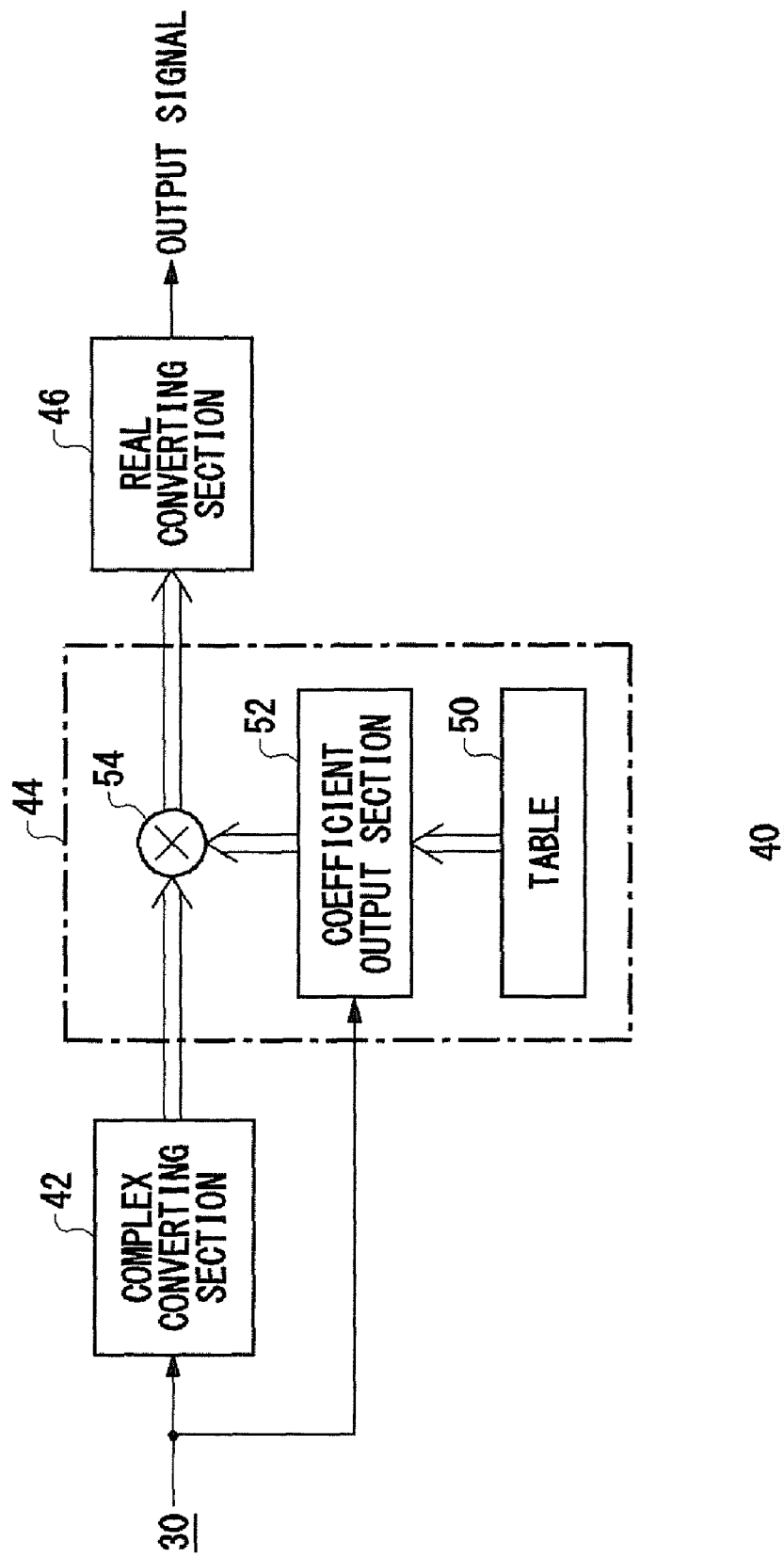
FIG. 8 shows an exemplary configuration of the common compensating section 40.

FIG. 8 shows an exemplary configuration of the common compensating section 40. The common compensating section 40 includes a complex converting section 42, a complex correcting section 44, and a real converting section 46. The complex converting section 42 converts the signal output by the combining section 30 into a complex signal expressed as a complex number. For example, the complex converting section 42 may generate the complex signal to have the output signal from the combining section 30 as the real part and a signal with a phase shifted 90 degrees from that of the output signal as the imaginary part. The complex converting section 42 may use a Hilbert transform to convert the signal expressed as a real number into the complex signal expressed as a complex number.

The complex correcting section 44 generates a complex compensated signal by correcting the complex signal with a correction coefficient expressed as a complex number. The complex correcting section 44 may include a table 50, a coefficient output section 52, and a complex multiplying section 54.

The table 50 stores the common non-linear distortion compensation coefficient. The table 50 of the present embodiment stores the correction coefficient of the signal at each amplitude as the common non-linear distortion compensation coefficient. For example, the amplitude gain between the input and output of each AD converters 10 is calculated at each amplitude of each individual signal by comparing the input signal of the reference AD converters 10 and the individual signal output by the corresponding AD converters 10. The table 50 may then store the common non-linear distortion compensation coefficient for correcting the difference between the linear characteristic and the characteristic of the amplitude gain. The table 50 may calculate a function that differs by a phase of 90 degrees from the common non-linear distortion compensation coefficient obtained as a real number, and may calculate the common non-linear distortion compensation coefficient as a complex number by setting this function to be the imaginary part.

In other words, the table 50 may store, in association with the amplitude of each individual signal, a correction coefficient corresponding to the inverse of the non-linear characteristic of the reference AD converters 10. In this case, the inverse characteristic of the AD converters 10 may represent a ratio between (i) the phase and amplitude of the individual signal converted to be a complex number and (ii) the phase and amplitude of the input signal expressed as a real number.

The coefficient output section 52 outputs the correction coefficient according to the amplitude of the output signal from the combining section 30. More specifically, the coefficient output section 52 reads, from the table 50, the correction coefficient that corresponds to the amplitude of the output signal from the combining section 30, and supplies this correction coefficient to the complex multiplying section 54.

The complex multiplying section 54 performs a complex multiplication between (i) the complex individual signal output by the complex converting section 42 and (ii) the correction coefficient supplied from the coefficient output section 52. The complex multiplying section 54 then outputs the complex multiplication result as the complex compensated signal. In this way, the complex correcting section 44 can generate the complex compensated signal.

The real converting section 46 converts the complex compensated signal output by the complex correcting section 44 into an output signal expressed as a real number. For example, the real converting section 46 may output the real part of the complex compensated signal as the output signal. The real converting section 46 may use an inverse Hilbert transform to convert the complex compensated signal expressed as a complex number into the output signal expressed as a real number. With this configuration, the common non-linear distortion can be compensated for in the output signal on the time axis output by the combining section 30.

Figure 9:
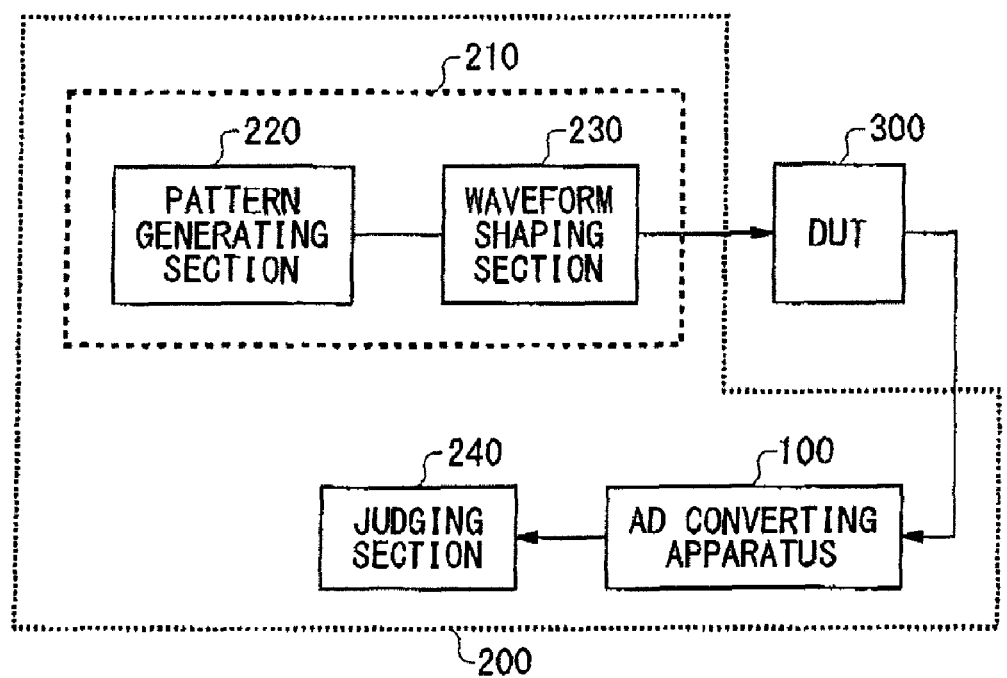
FIG. 9 shows an exemplary configuration of the test apparatus 200 according to an embodiment of the present invention.

FIG. 9 shows an exemplary configuration of the test apparatus 200 according to an embodiment of the present invention, along with a device under test 300. The test apparatus 200 tests the device under test 300, such as a semiconductor circuit, and includes a signal supplying section 210, the AD converting apparatus 100, and a judging section 240.

The signal supplying section 210 supplies a test signal to the device under test 300. For example, the signal supplying section 210 may supply the device under test 300 with a test signal causing the device under test 300 to perform a prescribed operation. The signal supplying section 210 of the present embodiment includes a pattern generating section 220 and a waveform shaping section 230. The pattern generating section 220 generates a logic pattern for the test signal. The waveform shaping section 230 shapes the waveform of the test signal according to the logic pattern generated by the pattern generating section 220.

The AD converting apparatus 100 converts an analog response signal, which is output by the device under test 300 in response to the test signal, into a digital output signal. The AD converting apparatus 100 may be the AD converting apparatus 100 described in any one of FIGS. 1 to 8.

The judging section 240 judges the acceptability of the device under test 300 based on the output signal from the AD converting apparatus 100. For example, the judging section 240 judges the acceptability of the device under test 300 based on whether the output signal from the AD converting apparatus 100 fulfills a prescribed specification.

With the test apparatus 200 of the present embodiment, the interleave AD converting apparatus 100 can sample the response signal at high speeds, and can therefore accurately test a high-speed device under test 300. Furthermore, in the interleave AD converting apparatus 100, the linear distortion and the non-linear distortion caused by the AD converters can be compensated for using a circuit with a small circuit size. In other words, the test apparatus 200 of the present embodiment can accurately test a high-speed device under test 300 using a circuit with a small circuit size.

Figure 10:
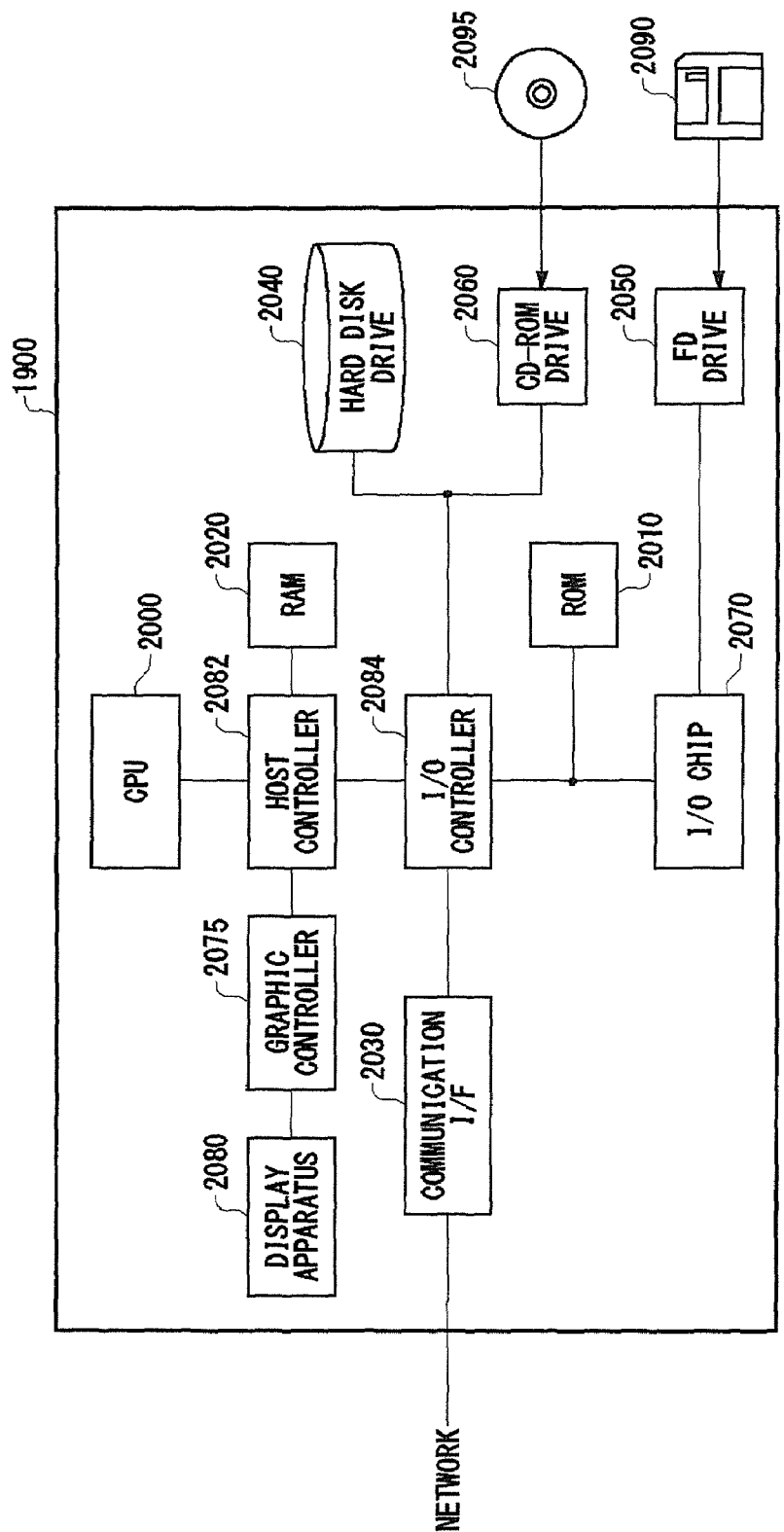
FIG. 10 shows an exemplary configuration of a computer 1900 according to the present embodiment.

FIG. 10 shows an example of a hardware configuration of a computer 1900 according to the present embodiment. The computer 1900 includes a program that causes the computer 1900 to function as the AD converting apparatus 100 described in relation to FIGS. 1 to 8. By executing this program, the computer 1900 may function as the AD converting apparatus 100 or may function as a portion of the AD converting apparatus 100. For example, the computer 1900 may function as one or all of the AD converters 10, the spectrum calculating sections 12, the individual compensating sections 20, the combining section 30, the common compensating section 40, and the measuring section 60 described in relation to FIGS. 1 to 8. Furthermore, by executing this program, the computer 1900 may function as the AD converting apparatus 100 or may function as a control apparatus that controls the AD converting apparatus 100.

The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as the AD converting apparatus 100 may be provided with a plurality of spectrum calculating modules, a plurality of individual compensating modules, a combining module, a common compensating module, and a measuring module. These programs and modules prompt the CPU 2000 or the like to make the computer 1900 function as the plurality of spectrum calculating sections 12, the plurality of individual compensating sections 20, the combining section 30, the common compensating section 40, and the measuring section 60.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An AD converting apparatus that converts an analog input signal into a digital output signal, comprising:
    a plurality of AD converters that are supplied with sampling clocks differing from each other by a prescribed phase, and that each output an individual signal obtained by digitizing the input signal according to the sampling clock supplied thereto;
    a common compensating section that commonly compensates for prescribed common non-linear distortion in the individual signals;
    a plurality of individual compensating sections that each individually compensate for individual non-linear distortion in a corresponding one of the individual signals, the individual non-linear distortion obtained as a ratio between the non-linear distortion and the common non-linear distortion in each individual signal; and
    a combining section that combines the individual signals to generate the output signal.

2. The AD converting apparatus according to claim 1, wherein
    each individual compensating section individually compensates the corresponding individual signal for the individual non-linear distortion together with linear distortion occurring in the individual signal.

3. The AD converting apparatus according to claim 2, wherein
    each individual compensating section individually compensates the corresponding individual signal for (i) the individual non-linear distortion, which is obtained as a ratio, at each frequency component, between a spectrum of the non-linear distortion in the individual signal and a spectrum of the common non-linear distortion, together with (ii) the linear distortion, which is obtained as a ratio, at each frequency component, between a spectrum of the input signal and a spectrum of the individual signal.

4. The AD converting apparatus according to claim 3, wherein
    non-linear distortion in a certain one of the individual signals is treated as the common non-linear distortion, and the common compensating section commonly compensates for the common non-linear distortion in the individual signals.

5. The AD converting apparatus according to claim 4, wherein
    a harmonic component, with respect to the input signal, in a certain individual signal is treated as the common non-linear distortion, and the common compensating section commonly compensates for the common non-linear distortion in the individual signals.

6. The AD converting apparatus according to claim 5, wherein
    the combining section generates the output signal by combining the individual signals in which the signal distortion has been compensated for by the individual compensating sections, and
    the common compensating section compensates for the common non-linear distortion in the output signal generated by the combining section.

7. The AD converting apparatus according to claim 5, further comprising a measuring section that (i) calculates each individual non-linear distortion based on a ratio, at each frequency component, between the non-linear distortion of one of the individual signals serving as a reference and the non-linear distortion of the corresponding individual signal and (ii) sets, in each individual compensating section, a compensation coefficient according to the corresponding calculated individual non-linear distortion.

8. The AD converting apparatus according to claim 7, wherein
    the measuring section (i) is supplied with the linear distortion of each AD converter, (ii) calculates combined individual compensation coefficients that compensate for signal distortion that is a combination of the linear distortion and the individual non-linear distortion of the corresponding AD converter, and (iii) sets the calculated combined individual compensation coefficients in the corresponding individual compensating sections.

9. The AD converting apparatus according to claim 7, wherein
    the measuring section (i) is supplied with compensation coefficients that compensate for the linear distortion of the AD converters, (ii) calculates a combined individual compensation coefficient for each AD converter by combining the corresponding compensation coefficient that compensates for the linear distortion and a compensation coefficient that compensates for the non-linear distortion, and (iii) sets the calculated combined individual compensation coefficients in the corresponding individual compensating sections.

10. The AD converting apparatus according to claim 8, wherein
    the measuring section receives the individual signals in parallel with the individual compensating sections, and calculates the combined individual compensation coefficients that compensate the individual signals, based on the corresponding individual signal, and
    each individual compensating section compensates the corresponding individual signal based on the corresponding combined individual compensation coefficient calculated by the measuring section.

11. The AD converting apparatus according to claim 10, further comprising a spectrum calculating section that calculates a spectrum of each individual signal, wherein
    the measuring section calculates the combined individual compensation coefficients on a frequency axis, based on the spectra of the individual signals, and
    each individual compensating section compensates the spectrum of the corresponding individual signal using the corresponding combined individual compensation coefficient.

12. The AD converting apparatus according to claim 11, wherein
    the combining section generates the output signal on a time axis by combining the spectra compensated by the individual compensating sections, and
    the common compensating section compensates, on the time axis, the output signal generated by the combining section.

13. The AD converting apparatus according to claim 12, wherein the common compensating section includes:
    a complex converting section that converts the output signal into a complex signal expressed as a complex number;
    a complex compensating section that generates a compensated signal by compensating the complex signal with the compensation coefficient expressed as a complex number; and
    a real converting section that converts the compensated signal into a signal expressed as a real number, and that outputs this signal as the output signal.

14. An AD converting method for converting an analog input signal into a digital output signal, comprising:
- using a plurality of AD converters that are provided with sampling clocks differing from each other by a prescribed phase, and that each output an individual signal obtained by digitizing the input signal according to the sampling clock supplied thereto;
- commonly compensating for prescribed common non-linear distortion in the individual signals;
- individually compensating for individual non-linear distortion in each individual signal, the individual non-linear distortion obtained as a ratio between the non-linear distortion and the common non-linear distortion in each individual signal; and
- combining the individual signals to generate the output signal.

15. The AD converting method according to claim 14, wherein
- each individual signal is compensated for the individual non-linear distortion together with linear distortion occurring therein.

16. A test apparatus that tests a device under test, comprising:
- a signal supplying section that supplies a test signal to the device under test;
- an AD converting apparatus that converts an analog response signal, which is output by the device under test in response to the test signal, into a digital output signal; and
- a judging section that judges acceptability of the device under test based on the output signal from the AD converting apparatus, wherein the AD converting apparatus includes:
- a plurality of AD converters that are supplied with sampling clocks differing from each other by a prescribed phase, and that each output an individual signal obtained by digitizing the response signal according to the sampling clock supplied thereto;
- a common compensating section that commonly compensates for prescribed common non-linear distortion in the individual signals;
- a plurality of individual compensating sections that each individually compensate for individual non-linear distortion in a corresponding one of the individual signals, the individual non-linear distortion obtained as a ratio between the non-linear distortion and the common non-linear distortion in each individual signal; and
- a combining section that combines the individual signals to generate the output signal.

17. The test apparatus according to claim 16, wherein
- each individual compensating section individually compensates the corresponding individual signal for the individual non-linear distortion together with linear distortion occurring in the individual signal.

18. A non-transitory computer readable medium comprising instructions that, when executed by a processor, cause an AD converting apparatus, which converts an analog input signal into a digital output signal, to function, the AD converting apparatus functioning as:
- a plurality of AD converters that are supplied with sampling clocks differing from each other by a prescribed phase, and that each output an individual signal obtained by digitizing the input signal according to the sampling clock supplied thereto;
- a common compensating section that commonly compensates for prescribed common non-linear distortion in the individual signals;
- a plurality of individual compensating sections that each individually compensate for individual non-linear distortion in a corresponding one of the individual signals, the individual non-linear distortion obtained as a ratio between the non-linear distortion and the common non-linear distortion in each individual signal; and
- a combining section that combines the individual signals to generate the output signal.

19. The computer readable medium according to claim 18, wherein
- each individual compensating section individually compensates the corresponding individual signal for the individual non-linear distortion together with linear distortion occurring in the individual signal.

* * * * *